United States Patent [19]

Nolan et al.

[11] Patent Number: 4,845,426
[45] Date of Patent: Jul. 4, 1989

[54] TEMPERATURE CONDITIONER FOR TESTS OF UNPACKAGED SEMICONDUCTORS

[75] Inventors: L. Brent Dickson, Sunnyvale; Gaylen T. Grover, Cupertino; Charles C. Nolan, Sunnyvale, all of Calif.; and Stuart Sahr, Wickenburg, Ariz.

[73] Assignee: Signatone Corporation, Gilroy, Calif.

[21] Appl. No.: 51,705

[22] Filed: May 20, 1987

[51] Int. Cl.⁴ .............................................. G01R 31/26
[52] U.S. Cl. .................................................. 324/158 F
[58] Field of Search ............ 324/158 F, 158 P, 73 PC

[56] References Cited

U.S. PATENT DOCUMENTS 3,710,251  1/1973  Hagge et al. ................... 324/158 F
4,115,736  9/1978  Tracy ............................. 324/158 F Primary Examiner—Jerry Smith
Assistant Examiner—Stephen M. Baker
Attorney, Agent, or Firm—Linval B. Castle

[57] ABSTRACT

A prober for the electrical testing of unpackaged integrated circuits on a semiconductor wafer can test these devices between subfreezing to elevated temperatures without generating atmospheric fog or frost on the wafer or associated equipment by directing an enclosed tubular curtain of dry gas, such as heated liquid nitrogen, down from a circular nozzle above the wafer to encircle the device under test. Observations can be made and electrical tests performed within the curtain while all moist atmospheric air is purged from the wafer and surrounding areas so that fog and frost cannot form.

7 Claims, 2 Drawing Sheets

TEMPERATURE CONDITIONER FOR TESTS OF UNPACKAGED SEMICONDUCTORS

BRIEF BACKGROUND OF THE INVENTION

This invention relates generally to the heating and cooling of objects to be tested and particulatly to the electrical testing of unpackaged integrated circuit chips uncut from their wafers at subfreezing and at high temperatures.

In the production of integrated circuit (IC) devices, it is obviously essential that they be electrically tested prior to their installation as circuit components. Numerous types of circuit test jigs have been developed which will receive various size and types of packaged IC devices and will make the electrical tests necessary to prove that the IC device is properly functional.

While these types of test fixtures may be accurate and provide the proper functional tests, much greater economy is realized by providing the same electrical test to unpackaged circuits that have not yet been cut from the wafer upon which they were formed. The cost of such unpackaged and uncut circuits may be minimal; the cost of cutting an IC from the wafer and packaging it is relatively high.

During the production of integrated circuits, the electrical testing of the unpackaged and uncut chips is accomplished with a prober such as manufactured by Signatone Corporation of Santa Clara, Calif. The prober incorporates a microscope which enables a technician to accurately position a wafer secured to the surface of a vacuum chuck on a movable stage so that the very fine terminal conductors on a selected IC on that wafer may be electrically contacted by hairlike probe tips that extend from adjustable probe positioners, or probe cards, which are coupled to associated electronic test circuitry.

If production quantities of a particular IC are to be tested with a prober, a probe card having a central hole with prepositioned probe tips extending into the hole may be used. The probe tips are arranged so that their tip ends will simultaneously contact all terminal conductors on the IC when the wafer is precisely positioned and the stage is then raised to form the contact between probe tips and IC.

Tests performed with a prober on unpackaged and uncut integrated circuits are often at room temperatures. Tests at elevated temperatures may readily be performed by the use of hollow vacuum chuck by heating the chuck, the wafer, and finally its circuits by passing a fluid at the desired elevated temperature through the chuck or by using an electrical heater buried in the chuck. Unfortunately, very cold tests cannot be readily be performed in the same manner. If chilled fluid is passed through the chuck, the formation of atmospheric moisture on the IC at the dew point will alter the electrical characteristics of the IC, and further cooling will result in frost damages to the IC, fogging of the microscope optics, etc.

Many manufacturers are interested in the characteristics of semiconductor devices at temperature extremes, and many require full electrical testing of every device at such temperature extremes. The invention described herein provides the cooling and/or heating of integrated circuits on a wafer over a wide range of temperatures of between approximately $-55°$ C. to $+150°$ C. or greater. without danger of fogging or frosting and, further, permits rapid temperature changes because the vacuum chuck retaining the wafer is not required to be heated or cooled during the heating and cooling of the wafer.

Briefly described, the invention includes a toroidal chamber or nozzle that is positioned over the central hole and prepositioned probe tips in a probe card. The nozzle has a nitrogen gas inlet coupled through a temperature controllable heater to a source of liquid nitrogen. The downfacing nozzle directs a tubular curtain of the gas down through the probe card hole and upon the surface of a IC wafer located on a thermally insulated stage-mounted vacuum chuck beneath the probe card. The thermal insulation allows the temperature on the wafer to rapidly change without changing the temperature of its surroundings. Some of the dry gas flows laterally under the probe card to purge the atmosphere from the remainder of the wafer and from the prober itself while a portion of the gas is reflected back to the nozzle area to maintain a positive pressure of dry gas and to prevent icing of the upper nozzle surface, the microscope, the probe card, etc. The nozzle contains a temperature sensor for controlling a heater to warm the freezing gas to the temperature desired for its application to the wafer surface.

BRIEF DESCRIPTION OF THE DRAWINGS

In the drawings which illustrate the preferred embodiment of the invention.

DETAILED DESCRIPTION OF THE PREFERRED EMBODIMENT

Figure 1:
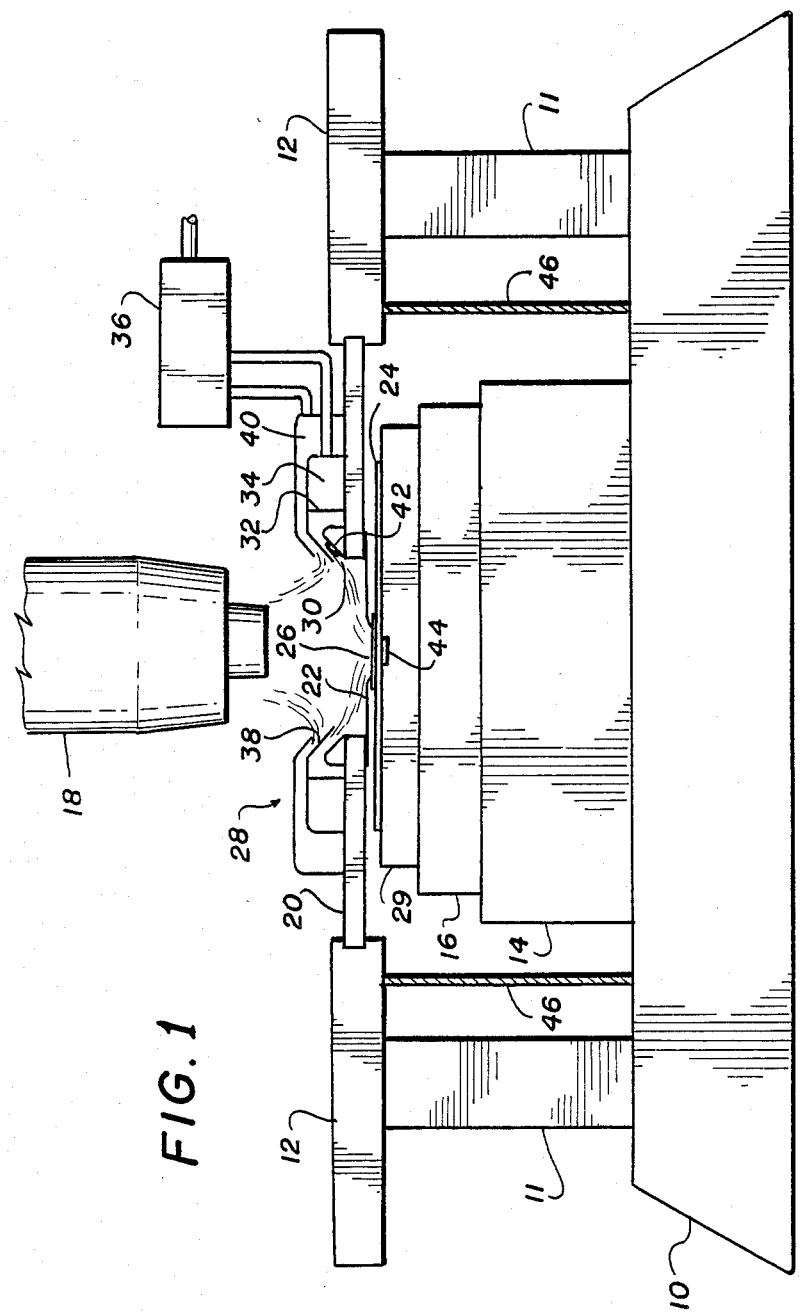
FIG. 1 is a simplified elevational view of analytical prober with the specimen temperature controller.
Figure 2:
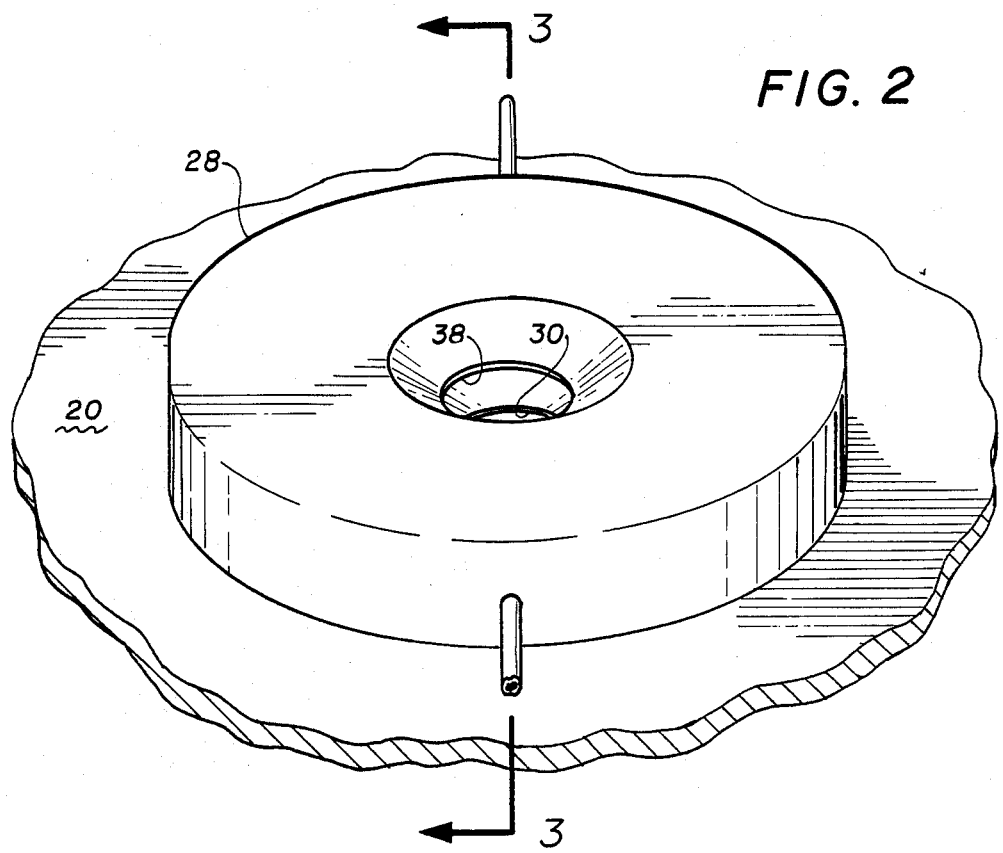
FIG. 2 is a perspective view of the toroidal temperature controlling gas curtain nozzle of the invention.

Illustrated in FIG. 1 is a simplified analytical prober which includes a heavy stable base 10 which supports on side pedestals 11 a vertically movable U-shaped platen 12. Positioned on the surface of the base and below the open front of the U-shaped platen is a roll-out stage 14 having controls for fine adjustments in X, Y and Z directions. Secured to the surface of the stage 14 is a vacuum chuck 16 and a microscope 18 is centered over the chuck.

During normal operation in which temperatures are of no particular concern, a silicon wafer having a typical thickness of 250 to 600 microns and which may contain a hundred or more individual integrated circuits is secured directly to the surface of the vacuum chuck 16 and the stage 14 is adjusted to observe one of the integrated circuits in the microscope field of view. If only a few circuits are to be tested, or if the test involves contacting only two or three of the very fine conductors on the circuit then movable probe positioners, each with one probe tip, are secured by vacuum on the flat surface of the platen 12 and their probe tips are carefully adjusted to contact the desired circuit conductors.

If, on the other hand, many identical devices are to be tested then a probe care 20 is inserted into an adapter secured in the open front portion of the U-shaped platen. The probe card is a typical "plug-in" circuit card with a central hole into which extend probe tips 22 corresponding in number to the number and also the location of device conductors to be contacted. Thus, to perform a test on a circuit, the circuit is accurately positioned under the hole in the probe card and the stage 14 is raised by its Z adjustment until contact is made with the probe tips. The probe tips 22 are coupled through the probe circuit card to appropriate associated test circuitry which performs the required test on the device.

As previously mentioned, the vacuum chuck 16 may be heated for the electrical testing of devices on wafers directly coupled to the chuck, but the application of chilled fluids for cold testing results in atmospheric dew and even frost on the wafer to the detriment of the IC devices. Furthermore, a considerable amount of time is required to heat an IC device on a wafer to a desired test temperature because of heat losses due to the mass of the chuck 14, the heat conductivity between chuck and metal stage 14, and also the need to heat the thin wafer material. In the system now to be described, the IC device directly receives the temperature controling medium at the desired extreme testing temperature and is nearly instantly brought up or down to that temperature.

As illustrated in the simplified elevational view of FIG. 1, a wafer 24 having thereon a device 26 to be tested is positioned on the surface of a heat insulating pad 29 which is positioned on the surface of the chuck 16. Temperature changes made to the device 26 and its wafer 24 cannot, therefore, be affected by the masses of the chuck 16 or stage 14. The device 26 is aligned on the optical axis of the microscope 18 and is centered in the hole in the probe card 20 so that the various probes 22 on the card will contact the conductors on the device when the stage 14 is raised.

Figure 3:
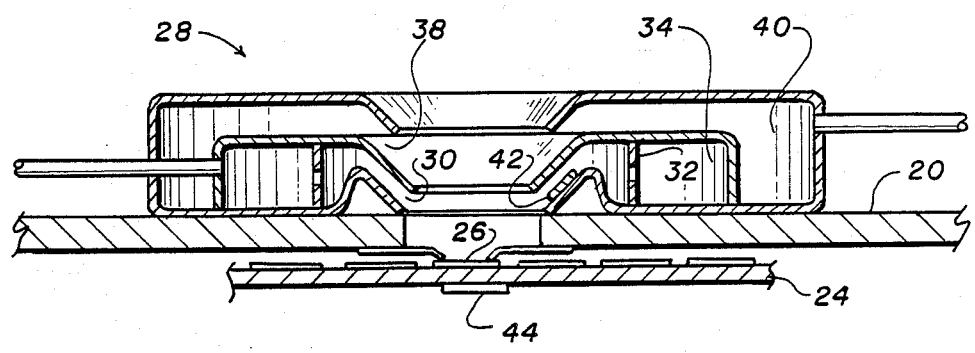
FIG. 3 is a sectional elevational view taken along the lines 3—3 of FIG. 2 and illustrates the gas curtain nozzle in detail.

Positioned on the top surface of the probe card 20 is a toroidal nozzle 28 having a central hole coaxially aligned on the optical axis of the microscope 18. The nozzle is formed with two annular vents that open into the central hole. A first vent 30 is directed downward through the nozzle central hole and is coupled through a perforated baffle ring 32 to an annular plenum 34 as best shown in the sectional view of FIG. 3. The plenum is coupled through a temperature controllable heater 36 to a source of liquid nitrogen or other extremely cold, dry, inert gas.

The second annular vent 38 in the nozzle overlies the vent 30; it is physically shorter than the first nozzle 30 and is coupled to an annular chamber 40 which surrounds the top and exterior surface of the plenum 34 and which receives dry nitrogen after it has been heated to approximately room temperature or slightly higher. Thus, the warm dry gas within the chamber 40 prevents exterior surface chilling of the nozzle and possible atmospheric dew from forming and the small amount of warm dry gas emitted through its vent 38 will drift upward to prevent possible fogging of the microscope 18.

The gas heater 36 receives nitrogen gas from an associated liquid nitrogen tank at its dew point of −220° C. and heats a small portion to near room temperature for the chamber 40 and second vent 38. The heater 36 must also heat a supply of gas to the temperature necessary for the testing of a device. This testing temperature is controlled by external controls which are not part of the invention and the selected temperature of the gas emitted through the first vent 30 is monitored by a sensor 42 located in that vent. A second temperature sensor 44, placed in the surface of the thermal insulator pad 28, is used during calibration so that an associated microprocessor can control the gas temperature and flow rate through the nozzle to ensure accurate temperatures of the device 26 under test.

In use, the temperature regulated gas emitted from the plenum 34 and first vent 30 falls in the form of a tubular curtain to the surface of the wafer 24 and spreads over the probe tips, previously at room temperature and which could perform as heat sinks, and the IC devices on the wafer to rapidly change their temperatures to that of the gas. To prevent the intrusion of moisture laden atmospheric air, the base area of the prober instrument is substantially sealed with a surrounding baffle structure 46 or similar structure so that the dry gas introduced through the nozzle 28 and flowing down over the wafer will purge all moisture laden room air from the apparatus in the areas below the gas emitting nozzle 28. Thus, during cold testing, the system is self-correcting in that no frost can form on a wafer if it is warm due to the lack of the cold dry gas, nor will frost form when it is cold because only the dry gas can chill the wafer.

We claim:

1. In combination with a test instrument having optical means for observing a device to be tested in said instrument under subfreezing and elevated temperatures, the device being mounted in said instrument and exposed to room atmosphere, a temperature conditioner for adjusting the temperature of the device to a desired subfreezing and elevated temperature without a resulting production of fog and frost on the device and the optical means, said temperature conditioner comprising:
   temperature controllable gas heating means coupled to a source of dry gas;
   a gas ejecting nozzle interposed between the optical means and the device and coupled to said gas heating means, said nozzle having a gas ejecting vent for forming an enclosed curtain of said gas surrounding said device, said ejecting nozzle including an annular plenum for receiving said gas from said gas heating means, said plenum transmitting said received gas through a perforated baffle plate to an annular gas ejecting vent for forming an enclosed tubular shaped curtain of said gas.

2. The temperature conditioner claimed in claim 1 wherein said source of dry gas is a source of liquid nitrogen.

3. The temperature conditioner claimed in claim 1 wherein said gas ejecting nozzle further includes a second gas chamber coupled to said heating means and surrounding exposed exterior surfaces of said plenum, said second chamber receiving said dry gas at room temperatures and higher and ejecting said gas through a second vent for surrounding the optical means with said dry gas.

4. The temperature conditioner claimed in claim 3 wherein said optical means is a microscope and wherein said device to be tested is an unpackaged semiconductor on a wafer, the dry gas ejected from the plenum and vent surrounding said semiconductor and spreading over said wafer.

5. The temperature conditioner claimed in claim 4 further including temperature sensing means within the vent coupled to said plenum.

6. The temperature conditioner claimed in claim 4 wherein said wafer is mounted upon a thermally insulated pad.

7. The temperature conditioner claimed in claim 4 further including baffle means connected to said test instrument for sealing the area surrounding said wafer against the intrusion of atmospheric moisture.

* * * * *